United States Patent [19]

Kameyama

[11] Patent Number: 4,914,438

[45] Date of Patent: Apr. 3, 1990

[54] DIGITAL INFORMATION CODING SYSTEM

[75] Inventor: Tadahiko Kameyama, Odawara, Japan

[73] Assignee: Hitachi, Ltd., Chiyoda, Japan

[21] Appl. No.: 226,321

[22] Filed: Jul. 29, 1988

[30] Foreign Application Priority Data

Sep. 1, 1987 [JP] Japan .................. 62-216396
Sep. 12, 1987 [JP] Japan .................. 62-226477

[51] Int. Cl.$^4$ ............................ H03M 7/00
[52] U.S. Cl. ........................ 341/59; 360/40
[58] Field of Search ............ 341/59; 360/39, 40

[56] References Cited

U.S. PATENT DOCUMENTS 4,675,652  6/1987  Machado ................ 341/59
4,688,016  8/1987  Fok ....................... 341/59

FOREIGN PATENT DOCUMENTS 55-47539   4/1980  Japan .
58-13020   1/1983  Japan .
58-119273  7/1983  Japan .

OTHER PUBLICATIONS

"Sequence-State Methods for Run-Length-Limited Coding", Franaszek, IBM Journal of Research and Development, vol. 14, No. 4, pp. 376–383.

Primary Examiner—William M. Shoop, Jr.
Assistant Examiner—Marc S. Hoff
Attorney, Agent, or Firm—Kenyon & Kenyon

[57] ABSTRACT

In a digital information coding system for transforming a binary digital information train without limitation of bit arrangement into run length limited binary codes, the run length taking only a value obtained by adding an integer multiple of a specific positive integer s to a minimum value d, within the range of the minimum value d and the maximum value k, and the positive integer s is 2 or more and is an aliquant number relative to d+1, and the maximum value k is a value obtained by adding an integer multiple of the positive integer s to the minimum value d. The advantages of this coding system are that the gradient of a magnetization reversal distance relative to a discrimination timing window width can be set as desired, and that the minimum magnetization reversal distance and the effective data discrimination timing window width during signal reproducing can be set as desired within the range of the channel capacities and have a considerable degree of freedom which has not been obtained by conventional codes.

12 Claims, 9 Drawing Sheets

DISCRIMINATION TIMING WINDOW WIDTH (S·m/n)

FIG. 1A
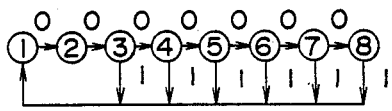
FIG. 1B
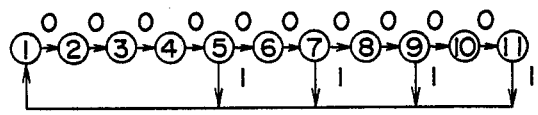
FIG. 2
$$\{S_{ij}\} = \begin{pmatrix} 0 & 1 & 0 & 0 & 0 & 0 & 0 & 0 \\ 0 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 1 & 0 & 0 & 0 & 0 & 0 & 0 & 1 \\ 1 & 0 & 0 & 0 & 0 & 0 & 0 & 0 \end{pmatrix}$$
FIG. 3
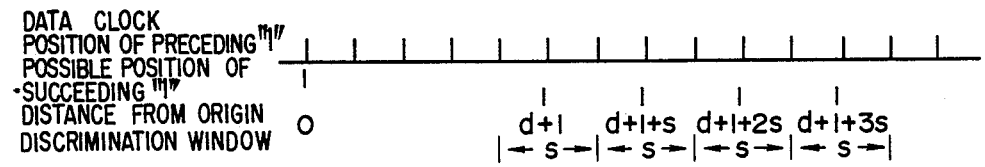

FIG. 5A

| | |
|---|---|
| 1 | 000000001 00001 |
| 2 | 0000001 000000 1 |
| 3 | 00001 000000001 |
| 4 | 001 00000000001 |
| 5 | 1 0000000000001 |
| 6 | 000000 1 0000100 |
| 7 | 00001 000000100 |
| 8 | 001 00000000100 |
| 9 | 1 0000000000100 |
| 10 | 00001 000010000 |
| 11 | 001 00000010000 |
| 12 | 1 000000001 0000 |
| 13 | 00100001000000 |
| 14 | 10000001000000 |
| 15 | 10000100000000 |
| 16 | 00000000000010 |
| 17 | 00100001000010 |
| 18 | 10000001000010 |
| 19 | 10000100000010 |
| 20 | 00000000001000 |
| 21 | 10000100001000 |
| 22 | 00000000100000 |
| 23 | 00000010000000 |
| 24 | 00001000000000 |
| 25 | 00100000000000 |
| 26 | 10000000000000 |
| 27 | 00000000000001 |
| 28 | 00010000100001 |
| 29 | 01000000100001 |
| 30 | 01000010000001 |
| 31 | 00000000000100 |
| 32 | 01000010000100 |
| 33 | 00000000010000 |
| 34 | 00000001000000 |
| 35 | 00000100000000 |
| 36 | 00010000000000 |
| 37 | 01000000000000 |
| 38 | 00000001000010 |
| 39 | 00000100000010 |
| 40 | 00010000000010 |
| 41 | 01000000000010 |
| 42 | 00000100001000 |
| 43 | 00010000001000 |
| 44 | 01000000001000 |
| 45 | 00010000100000 |
| 46 | 01000000100000 |
| 47 | 01000010000000 |

| NUMBER | CODE |
|---|---|
| 1 | 00000000 |
| 2 | 00001001 |
| 3 | 00100001 |
| 4 | 10000001 |
| 5 | 00100100 |
| 6 | 10000100 |
| 7 | 10010000 |
| 8 | 00000010 |
| 9 | 10010010 |
| 10 | 00001000 |
| 11 | 00100000 |
| 12 | 10000000 |
| 13 | 00000001 |
| 14 | 01001001 |
| 15 | 00000100 |
| 16 | 00010000 |
| 17 | 01000000 |
| 18 | 00000000 |
| 19 | 00010010 |
| 20 | 01000010 |
| 21 | 01001000 |

FIG. 6B

| CURRENT STATE NUMBER \ INPUT DATA | 000 | 001 | 010 | 011 | 100 | 101 | 110 | 111 |
|---|---|---|---|---|---|---|---|---|
| 1 | 4/1 | 6/1 | 3/1 | 5/1 | 7/1 | 9/1 | 11/1 | 12/1 |
| 2 | 2/2 | 3/2 | 5/2 | 8/2 | 10/2 | 11/2 | 1/2 | 7/5 |
| 3 | 2/3 | 3/3 | 5/3 | 8/3 | 10/3 | 11/3 | 1/3 | 9/5 |
| 4 | 2/4 | 3/4 | 5/4 | 8/4 | 10/4 | 11/4 | 1/4 | 9/6 |
| 5 | 2/5 | 3/5 | 5/5 | 8/5 | 10/5 | 11/5 | 4/5 | 6/5 |
| 6 | 2/6 | 3/6 | 5/6 | 8/6 | 10/6 | 7/6 | 4/6 | 6/6 |
| 7 | 2/7 | 3/7 | 5/7 | 8/7 | 10/7 | 7/7 | 4/7 | 6/7 |
| 8 | 14/8 | 16/8 | 17/8 | 19/8 | 20/8 | 21/8 | 15/8 | 13/8 |
| 9 | 14/9 | 16/9 | 17/9 | 19/9 | 20/9 | 21/9 | 15/9 | 13/9 |
| 10 | 14/10 | 16/10 | 17/10 | 19/10 | 20/10 | 21/10 | 15/10 | 13/10 |
| 11 | 14/11 | 16/11 | 17/11 | 19/11 | 20/11 | 21/11 | 15/11 | 12/11 |
| 12 | 14/12 | 16/12 | 17/12 | 19/12 | 20/12 | 21/12 | 9/7 | 12/7 |
| 13 | 1/13 | 2/13 | 3/13 | 5/13 | 8/13 | 10/13 | 11/13 | 9/16 |
| 14 | 1/14 | 2/14 | 3/14 | 5/14 | 8/14 | 10/14 | 11/14 | 9/17 |
| 15 | 4/15 | 2/15 | 3/15 | 5/15 | 8/15 | 10/15 | 11/15 | 7/15 |
| 16 | 4/16 | 2/16 | 3/16 | 5/16 | 8/16 | 10/16 | 11/16 | 7/16 |
| 17 | 4/17 | 2/17 | 3/17 | 5/17 | 6/17 | 10/17 | 11/17 | 7/17 |
| 18 | 14/18 | 17/18 | 20/18 | 21/18 | 6/15 | 9/15 | 12/15 | 6/16 |
| 19 | 14/19 | 17/19 | 20/19 | 21/19 | 13/19 | 15/19 | 16/19 | 19/19 |
| 20 | 14/20 | 17/20 | 20/20 | 21/20 | 13/20 | 15/20 | 16/20 | 19/20 |
| 21 | 14/21 | 17/21 | 20/21 | 21/21 | 13/21 | 15/21 | 16/21 | 19/21 |

DIGITAL INFORMATION CODING SYSTEM

BACKGROUND OF THE INVENTION

The present invention relates to a digital information coding system for coding a bit train of binary digital information into a bit train suitable for use in digital recording, particularly for use in digital magnetic recording.

With coding methods suitable for high density digital recording, run length limited codes such as (2, 7) codes having a minimum run length of 2 (a minimum number of, e.g., "0s" inserted between "1" and "1") and a maximum run length of 7 (similarly, a maximum number of "0s"), (1, 7) codes having a minimum run length of 1 and a maximum run length of 7, and the like have been practically used.

Such coding methods are disclosed in particular, e.g., in Japanese Patent Laid-open Publications Nos. JP-A-55-47539, JP-A-58-13020, JP-A-58-119273 (corresponding to a U.S. Pat. No. 4,488,142) and the like.

The general characteristics such as channel capacity and the like of run length limited codes are described, e.g., in "IBM J. RES. DEVELOP.", Vol. 14, No. 4 (1970), pp. 376 to 383 and other publications.

The present invention seeks to provide the codes which have more generalized and extensive characteristics than those of already known run length limited codes. First, in order to clarify the problems associated with conventional run length limited codes, the characteristics of run length limited codes applied to digital magnetic recording will be described.

The characteristics of codes desired in digital magnetic recording are as follows:

(1) It is desired to have a large allowable value of time shift (which is called discrimination window width) between peak positions of reproduced signal pulses in order to discriminate codes of magnetically recorded digital signals. More particularly, in order to transform a usual code train without limitation of arrangement of "0" and "1" into another code train with limitation of arrangement such as run length limited codes, it becomes necessary to divide the original code train into blocks in units of m bits and transform each m bit block into an n bit code, where n is larger than m. The transformed digital code is magnetically recorded and reproduced. In this case, the data or code discrimination window width which is equal to the time occupied by one bit becomes m/n (which is represented by R) when the time length occupied by one bit of the original code is used as a time unit. For a desired characteristic, the value m/n should be as large as possible.

(2) It is desired to have a large minimum magnetization reversal distance in order to reduce interference between reproduced signal waveforms. Assuming that one magnetization reversal during recording occurs for each one transformed bit "1", the minimum magnetization reversal distance becomes d+1, where d is a minimum run length. The distance between adjacent "1s" becomes m/n×(d+1) (which is represented by R) when the time length occupied by one bit of the original code is used as a time unit. As the magnetization reversal distance between bits "1s" becomes larger, the interference between reproduced signal waveforms is more reduced so that it is desirable to have a larger value of m/n×(d+1).

The above-described characteristics (1) and (2) are illustrated in FIG. 4 with respect to conventionally used codes. In FIG. 4, the abscissa represents the discrimination timing window wodth W, i.e., m/n, and the ordinate represents the minimum magnetization reversal distance R, i.e., m/n×(d+1). The characteristic values as described with (1) and (2) are plotted relative to both the axes so that the desired characteristics are obtained at an upper right point in the graph. If a minimum run length is d, codes are plotted on a straight line with a gradient of d+1.

(2, 7) codes are represented at point 41 on a straight line with d=2, (1, 7) codes are represented at point 42 on a straight line width d=1, MFM codes are represented at point 43 on the straight line with d=1, and NRZ codes are represented at point 44 on a straight line with d=0.

It is necessary for a code with limitation of arrangement such as run length limited codes to satisfy the condition of m/n<C, where C is a channel capacity. Therefore, the allowable maximum value of m/n is dependent on a given minimum run length d. Such maximum values are shown in FIG. 4 for each minimum run length d at points 45 on straight lines with a gradation of d+1, wherein the maximum run length k is assumed infinite and the value of the channel capacity C is indicated by the abscissa. The channel capacity C can be calculated by the following formula:

$$C = \lim_{P \to \infty} \left[ 1/p \times \log_2 \sum_i \sum_j (S_{ij}) \right]$$

where ($S_{ij}$) is a state transition matrix such as shown in FIG. 2 corresponding to a code state transition diagram such as shown in FIGS. 1A and 1B which are described later. If an element (ij) is 1, it means a transition from state i to state j, and if 0, it means that there is no transition.

The performance of high density recording is limited by and dependent on an inferior one of the two characteristics (1) and (2). Consider the conventionally utilized (2, 7) codes and (1, 7) codes. The discrimination window widths thereof are 0.5 and 0.667 and the minimum magnetization reversal distances thereof are 1.5 and 1.333, respectively. A factor of limiting high density recording of (2, 7) codes is that the discrimination window width thereof is small although a relatively large minimum magnetization reversal distance is possible. On the contrary, a factor of limiting high density recording of (1, 7) codes is that the minimum magnetization reversal distance thereof is small although a relatively large discrimination window width is possible. If there are such codes as having an intermediate characteristic between those of the (2, 7) and (1, 7) codes, such balanced characteristic will lead to high density recording.

As understood from FIG. 4, however, the run length limited codes are present only on the straight lines with a gradation d+1 (d=0, 1, 2, ...), and the codes located on an intermediate straight line are not found. In other words, since the value d is an integer, a gradient (d+1) of a straight line can not be set at an optional value. All other binary codes such as those conventionally known FM, PE, MFM codes, which have not been usually classified as falling into the category of run length limited codes, can be considered as a kind of run length limited codes so that they suffer the same restriction as described above.

It is convenient if the gradation can be varied substantially and optionally. For example, if an intermediate straight line between d=1 and d=2 can be obtained, a desired characteristic between both the characteristics (1) and (2) can be used.

SUMMARY OF THE INVENTION

It is therefore an object of the present invention to solve the above-described problems encountered with conventional technique, substantially eliminate the above-described restriction, and provide the codes whose data discrimination window width and minimum magnetization reversal distance can be set at optional values within the limit of channel capacities as shown in FIG. 4.

In order to solve the above object, according to the digital information coding system of this invention, a binary code train of usual binary digital information without limitation of bit arrangement is transformed into a specific binary code train in the following manner. Namely, this new binary code train is constructed of run length limited codes of the type that between a first binary digit, e.g., "1" and the next first binary digit "1" of each code, a second binary digit, e.g., "0" is inserted, and that the number (run length) of inserted consecutive bits takes a value between an optional integer minimum value d and another integer maximum value k. The run length takes a value obtained by adding an integer multiple of a specific positive integer s to the minimum value d, within the range of the minimum value d and the maximum value k, wherein the positive integer s is 2 or more and is an aliquant number relative to d+1, and the maximum value k is a value obtained by adding an integer multiple of the positive integer s to the minimum value d.

For example, in case where each of 4 or 5 bit units of a binary code train of original digital information without limitation of bit arrangement is transformed into a 14 or 17 bit run length limited code, the above-mentioned values are set as d=4, k=16 and s=2.

A difference between a run length limited code of this invention and that of the prior art will be described below.

A conventional run length limited code can use as its run length all the integer values between the minimum value d and the maximum value k, whereas the coding according to this invention is realized under the following condition:

The run lengths of "0" are only permissible at values of each stepwise increment s added to the minimum value d within the range from the minimum value d to the maximum value k, the increment s being an optional positive integer of 2 or more and aliquant relative to (d+1). Namely, the run lengths of "0" are d, d+s, d+2s, d+3s, ..., K, and the other run lengths are not permissible. The value k takes a value obtained by adding an integer multiple of s to the minimum value d, and those run lengths having a value between d and k have a difference of an integer multiple of s therebetween. The state transition diagrams of codes having such limited bit arrangement are shown in FIGS. 1A and 1B taking the case of d=4, k=10 and s=2 by way of example. FIG. 1A is for a conventional (2, 7) code, and FIG. 1B is for a code of this invention.

Numeral ① in FIGS. 1A and 1B indicates that a state immediately after a bit "1" having been subjected to coding is generated. Numeral ③, for example, indicates a state where two consecutive "0s" were generated after "1". The case represented by ③→④ indicates a possibility of a transition from state ③ to state ④.

With the coding system constructed as above, optional and desired characteristics which have been not attained by conventional run length limited codes can be achieved with respect to the minimum magnetization reversal distance R and data discrimination window width W, respectively represented in units of bit interval of original binary digital information. This will further be detailed below:

First, consider the data discrimination window width W. If an m bit original code is transformed into an n bit code, then the one bit time length of the transformed code is m/n when one bit length of the original code is used as a time unit. The data discrimination window width W of such a transformed code virtually becomes s times the m/n value at the time of reproducing the transformed code. Particularly, timings when a next "1" is received after the preceding "1" was received are one bit interval times d+1, d+1+s, d+1+2s, d+1+3s, ... starting from the time when the preceding "1" was received. As a result, discriminating the position of the succeeding "1" after reception of the preceding "1" can be conducted using a discrimination window having its width of s bits. Such timings are shown in FIG. 3 for the case of d=4, k=10 and s=2 by way of example. The detailed description of the timings will be later given with respect to the preferred embodiments.

Next, as to the minimum magnetization reversal distance R, it can be represented as m/n×(d+1) when the one bit interval of an original code is used as a time unit. As illustrated in FIG. 4, since the ratio (i.e., gradient) of the minimum magnetization reversal distance R to the discrimination window width W is (d+1)/s, an optional gradient and hence desired characteristic can be obtained by changing the value s relative to the value d.

BRIEF DESCRIPTION OF THE DRAWINGS

FIGS. 1A and 1B are examples of the state transition diagrams respectively for a conventional code and for a code of this invention;

FIG. 2 shows a state transition matrix corresponding to the state transition diagrams shown in FIGS. 1A and 1B;

FIG. 3 illustrates an example of the discrimination window for the codes of this invention;

FIGS. 5A and 5B respectively show code blocks and a coding table of a first embodiment of the digital information coding system according to the present invention;

FIGS. 6A and 6B respectively show code blocks and a coding table of a second embodiment of the digital information coding system according to the present invention;

DETAILED DESCRIPTION OF THE PREFERRED EMBODIMENTS

Embodiments of the present invention will be described below.

First, a particular code transformation under the conditions of d=4, k=16 and s=2 will be described. The original code of m=4 bits can be transformed into a code of n=14 bits in one-to-one correspondence therebetween, the coding method of which will be described below. Such a code system is represented by a notation of (d, k, s, m, n) and is (4, 16, 2, 4, 14) for the above specific case.

There are 47 code blocks of 14 bits satisfying the above conditions of d=4, k=16 and s=2, as shown in FIG. 5A. The above conditions must be satisfied in coupling these code blocks one after another. However, if an original 4 bit code having 4 powers of 2 bit combinations, i.e., 16 bit combinations is arranged such that each bit combination has a corresponding code block, then it is not possible for all the succeeding code blocks to have corresponding 16 bit combinations. In view of this, a known sliding block coding method is employed to allow to have a corresponding code block in any possible case. This will be described below:

In applying the sliding block coding system to (4, 16, 2, 4, 14) codes, one of 44 "states" for 47 code blocks is set prior to the input of an original data block of m=4 bits. When an original data block of m=4 bits is inputted, the "state" is referred to for the decision of a code block to be outputted. A "state" to be used next is decided by the current "state" and the presently inputted data to thereby prepare for the next data input. With such an arrangement, it becomes possible to unambiguously decide a single code block to be outputted in response to the inputted data of any input data sequence.

Figure 7:
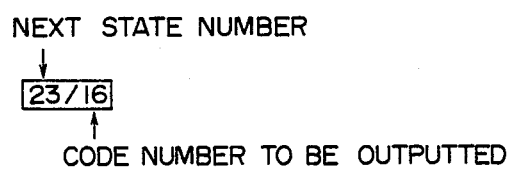
FIG. 7 illustrates a notation of numerals used in FIGS. 5B and 6B.
Figure 5B:
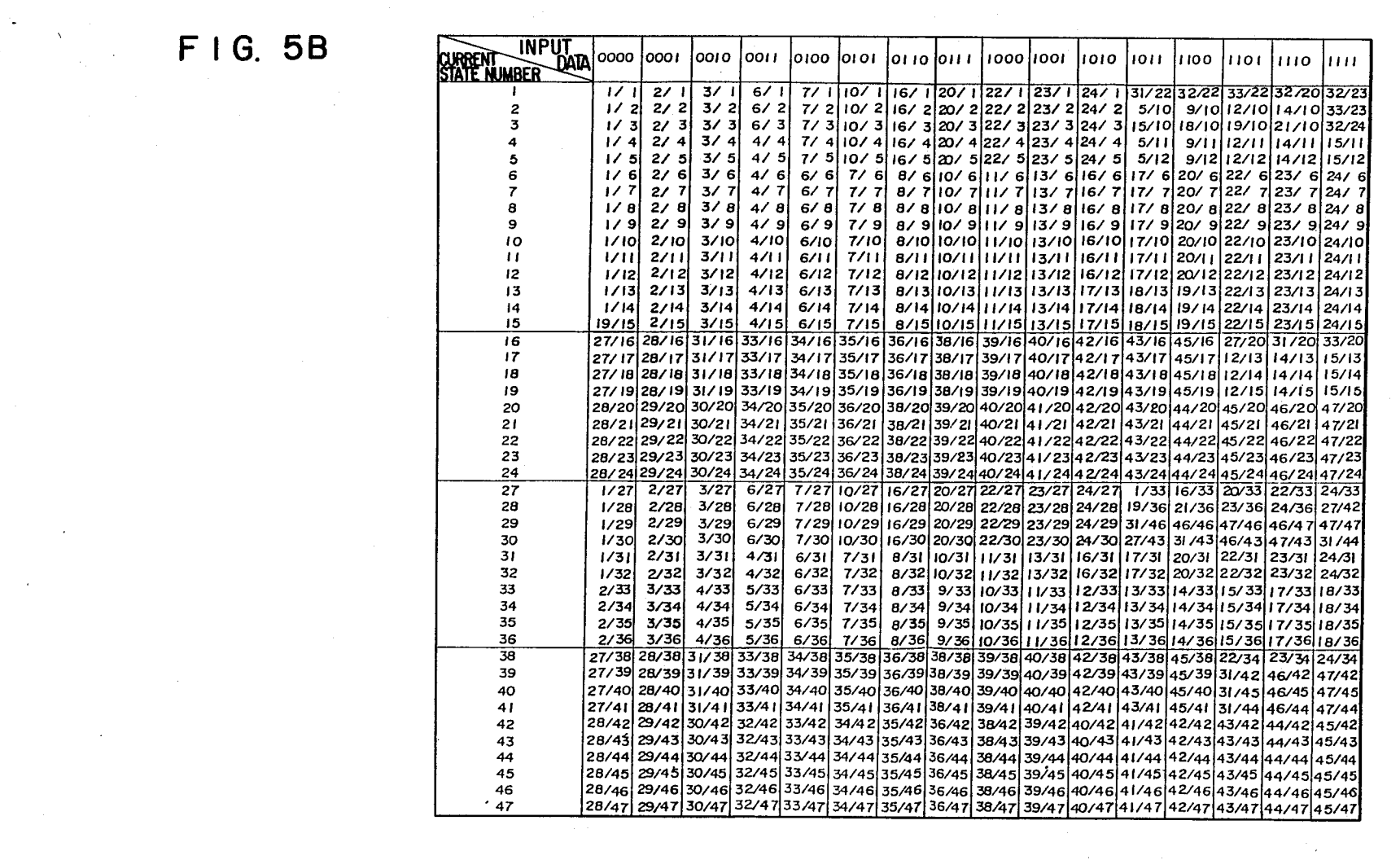

A particular example of correspondences between "next states" and "code blocks to be outputted" is shown in FIG. 5B, by using the "current states" and "inputted data" as parameters. The numerals shown in FIG. 5B are represented by using a notation as shown in FIG. 7 wherein the nominator represents a "next state" number and the denominator represents a "code block to be outputted (code number to be outputted)". Since the 25, 26 and 37-th code blocks shown in FIG. 5A are not used as shown in FIG. 5B, it is sufficient for both the codes and states to be 44 in number, respectively. If the code block is sequentially outputted in response to each input data in accordance with the table shown in FIG. 5B, the conditions of d=4, k=16 and s=2 can be satisfied in any input data sequence. In decoding such codes, an original data of 4 bit units can be unambiguously be identified by checking the transition state between two consecutive code blocks.

It can be readily understood that a practical means for realizing the above-described encoding and decoding can be realized through the provision of read-only memories and logic circuitries allowing the conversion and reverse-conversion of the tables shown in FIGS. 5A and 5B.

It was also found that an original data of 5 bits can be transformed into a code block of 17 bits under the conditions of d=4, k=16 and s=2 in the manner similar to the above. This coding system is called a (4, 16, 2, 5, 17) system, as in the case of the above embodiment. The description therefor is omitted.

The above embodiments have been described as using the sliding block coding method. However, other various coding methods may be used. Such coding methods do not directly relate to the gist of the present invention so that the description therefor is not further given.

Consider now the characteristics of the above two types of codes. The minimum magnetization reversal distances $R = m/n \times (d+1)$ represented by using a one bit interval of original data as a time unit are 1.429 and 1.471, respectively, and the discrimination window widths $W = m/n$ multiplied by s=2 are 0.571 and 0.588, respectively. When considering the resultant distances R and widths W, it can be seen that these codes have an intermediate characteristic between those of the (2, 7) codes and (1, 7) codes.

It was also found that an original data of 3 bits can be transformed into a code block of 8 bits under the conditions of d=2, k=10 and s=2 in the manner similar to the above. This coding system is called a (2, 10, 2, 3, 8) system as in the case of the above. In applying the sliding block coding system to the (2, 10, 2, 3, 8) codes, the code block table as used in the above embodiments is shown in FIG. 6A, and a particular example of correspondences between "next states" and "code blocks to be outputted" is shown in FIG. 6B, by using the "current states" and "inputted data" as parameters. Although the first and eighteenth codes shown in FIG. 6A have the same bit pattern, these codes are assigned a different number because these are assumed to be coupled with different codes.

It was further found that a (2, 18, 2, 4, 10) coding system is possible. In this case, for the application of the sliding block coding system, 37 code blocks and 37 states are required, the description therefor being omitted.

Of the codes of the two coding systems just described above, the minimum magnetization reversal distances R represented by using the one bit interval of original data as a time unit are 1.125 and 1.2 and the discrimination window widths W are 0.75 and 0.8, respectively. When considering the resultant distances R and widths W, it can be seen that these codes have an intermediate characteristic between those of the (1, 7) codes and NRZ codes. Especially the latter codes of the above two coding systems have the minimum magnetization reversal distance of 1.5 times that of the 4/5 conversion GCR codes conventionally used in magnetic tape recording/reproducing apparatus and the same discrimination window width as that of the 4/5 conversion GCR codes, thus resulting in a superior coding system.

It was also found that a (0, 6, 2, 4, 6) coding system is possible. In this case, for the application of the sliding block coding system, 31 code blocks and 31 states are required, the description therefor being omitted. The minimum magnetization reversal distance R of the codes takes a relatively small valve of 0.667, whereas the discrimination window width W becomes 1.333 which is larger than 1 and has not been considered possible heretofore.

The above description has been given to indicate that the codes having the characteristic heretofore not possible can be thus obtained.

Next, the description is given to indicate that the codes according to the present invention do not include those conventional codes. First, (1, 7) codes can be considered as available at s=1. However, if they are modified by using s=2, then s becomes an aliquot relative to d+1 so that (1, 7) codes are not included within this invention. Also, if the value s is other than 2 and 3, the value k does not become a value obtained by adding an integer multiple of s to d so that (1, 7) codes are not included within this invention. If only the value s=3 is used, then (1, 7) codes are included in this invention. The characteristics of such codes will then be discussed. In this case, the run lengths are 1, 4 and 7, and the calculation result of the channel capacity of such codes shows a value of about 0.372. Therefore, it is impossible to use m=2 and n=3 as conventional. Instead, to satisfy m/n<C, it is required to use, for instance, m=2 and n=6 and hence m/n=0.333. In such conditions, the minimum magnetization reversal distance R becomes 0.667 and the discrimination window width W becomes 1, which result in quite different characteristics from those of the conventional (1, 7) codes.

As to (2, 7) codes, there is no value s which satisfy the conditions of the present invention.

Next, a means for realizing data discrimination will be described, taking as an example the case where d=4, k=16 and s=2 similar to the above embodiments. In this case, there are 7 run lengths including 4, 6, 8, 10, 12, 14 and 16. Using the time when a preceding "1" occurs as a start time and the bit interval as the time unit, the times when the succeeding "1" are expected to occur are 5, 7, 9, 11, 13, 15 and 17. These times can be discriminated by 7 discrimination windows shown in FIG. 3, each window having a width of 2 and being partitioned at 4, 6, 8, 10, 12, 14, 16 and 18. The partitions at times 4 and 18 are not necessarily required for the discrimination of the 7 states, but these may be used in checking if the position of "1" exceeds above the predetermined range due to data error. Means for realizing the above data discrimination will be described particularly with reference to the block diagram shown in FIG. 8 and the timing chart of FIG. 9 in which waveforms at various portions of the circuit of FIG. 8.

Figure 8:
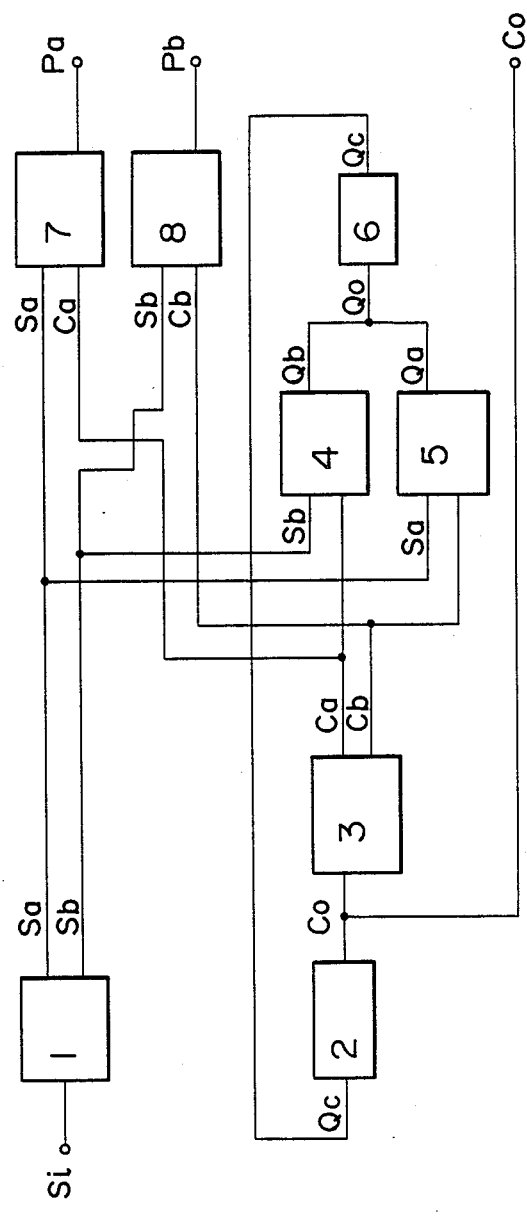
FIG. 8 is a block diagram of a circuit for discriminating codes of this invention during reproducing them.

FIG. 8 is a block diagram of the reproducing system of a magnetic recording/reproducing apparatus. The reproducing system comprises a two-phase splitter 1, a phase-locked-loop (PLL) 2, a two-phase splitter 3, phase comparators 4 and 5, a phase compensating filter 6, and phase discriminators 7 and 8. The two-phase splitter 1 is applied with a bit train of digital information Si read out from a magnetic recording medium (e.g., magnetic disc) by input means which is constructed of magnetic heads, amplifiers, wave-shaping circuits and the like.

For the signal reproducing operation by a magnetic recording/reproducing apparatus, clocks are generated by using a PLL as in a conventional manner. In this embodiment, however, clocks are divided into two phases. Then, a reproduced pulse signal train is splitted into two pulse signal trains. In the data discrimination, it is necessary to use the splitted reproduced signal and the divided clock, respectively of the same phase. To this end, the following method can be used effectively.

Figure 9:
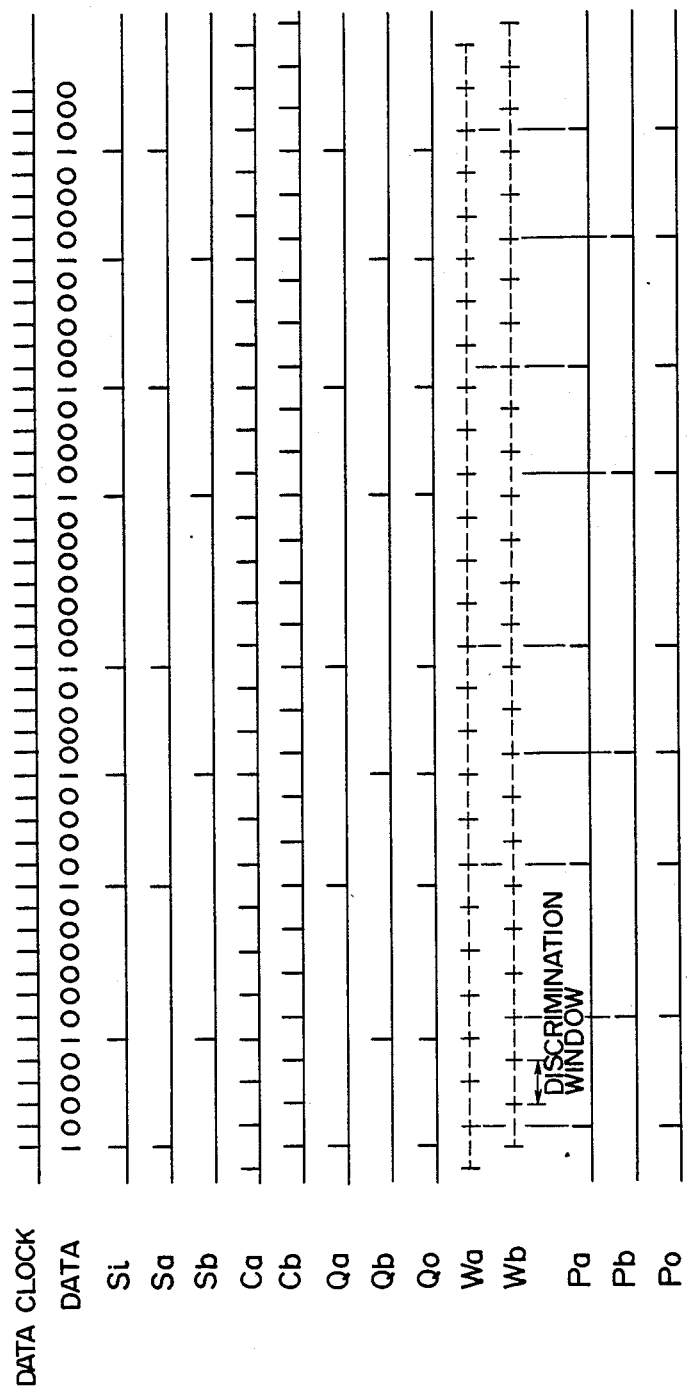
FIG. 9 shows signal waveforms at various portions of the circuit shown in FIG. 8.

Referring to FIG. 9, the reproduced pulse train Si is splitted into two pulse trains Sa and Sb by the two-phase splitter 1. The two pulse trains Sa and Sb are inputted to the phase comparators 4 and 5, respectively. Similarly, a clock output CO from the PLL 2 is splitted by the two-phase splitter 3 into two clock outputs Ca and Cb which are inputted to the phase comparators 4 and 5, respectively, to compare the phase thereof with those of the pulse trains Sa and Sb. It is to be noted that Sa is phase-compared with Cb, and Sb with Ca. The phase comparison results Qa and Qb are added together to obtain Q0 which passes the phase compensating filter 6 to obtain a control signal Qc for the PLL 2. By the above operations, the pulse train signal Sb becomes phase-synchronized with the clock Ca, and the pulse train signal Sa with the clock Cb.

In a usual digital magnetic recording/reproducing apparatus, a preamble of more than several tens bytes is added before the recorded data block so as to perform phase-synchronization of a PLL. Therefore, if the above-described two-phase split and phase-synchronization is adapted to be completed while the preamble is being reproduced, it becomes possible to perform data discrimination just from the top of the data signal.

Data discrimination is performed in the following manner. As shown in FIGS. 8 and 9, the reproduced signal Sa is discriminated by the discrimination window Wa defined by the clock Ca to thereby obtain the signal train Pa. Similarly, the reproduced signal Sb is discriminated by the discrimination window Wb defined by the clock Cb to thereby obtain the signal train Pb. It is to be noted that the discrimination window has a width corresponding to 2 clocks. The code train S0 identical with the recorded code train can be reproduced through logical OR between the signal trains Pa and Pb.

Generally, the clock and signal data are splitted in s phases.

Figure 10:
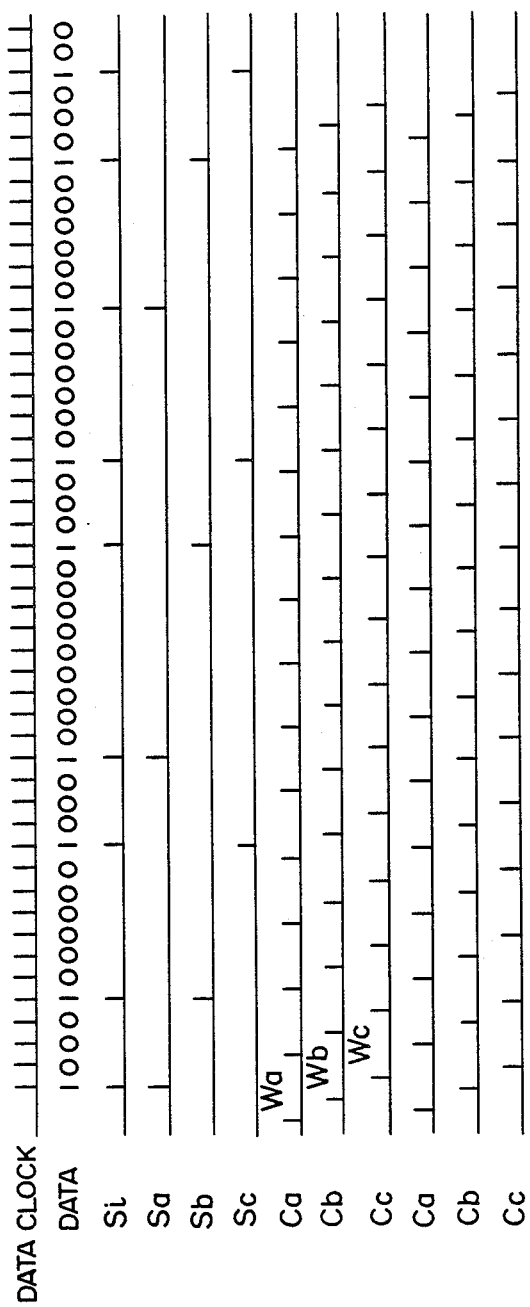
FIG. 10 shows similar signal waveforms at various portions of a circuit according to another embodiment of this invention.

If the value s is an odd number, it is desirable to use a clock shifted by one half the period as the control clock for the PLL. To this end, clock trains two times as many as that of the value s may be used. A data discrimination method for the case of s=3 will then be described with reference to FIG. 10 using the codes of d=3, k=12 and s=3.

A reproduced signal is splitted into three phase reproduced signals Sa, Sb and Sc. Three phase clocks Ca, Cb and Cc are also used. Control clocks Ca', Cb' and Cc' shifted by one half the period from each other are used for controlling the PLL. Phase comparison between the reproduced signals and the clocks is performed between Sa and Cb', Sb and Cc', and Sc and Ca'. Data discrimination is performed for Sa by Wa, for Sb by Wb and for Sc by Wc. Thus, the signal Sa, for example, has a discrimination window whose width is three times as large as the block interval and whose center is the clock Cb' timing point.

Figure 4:
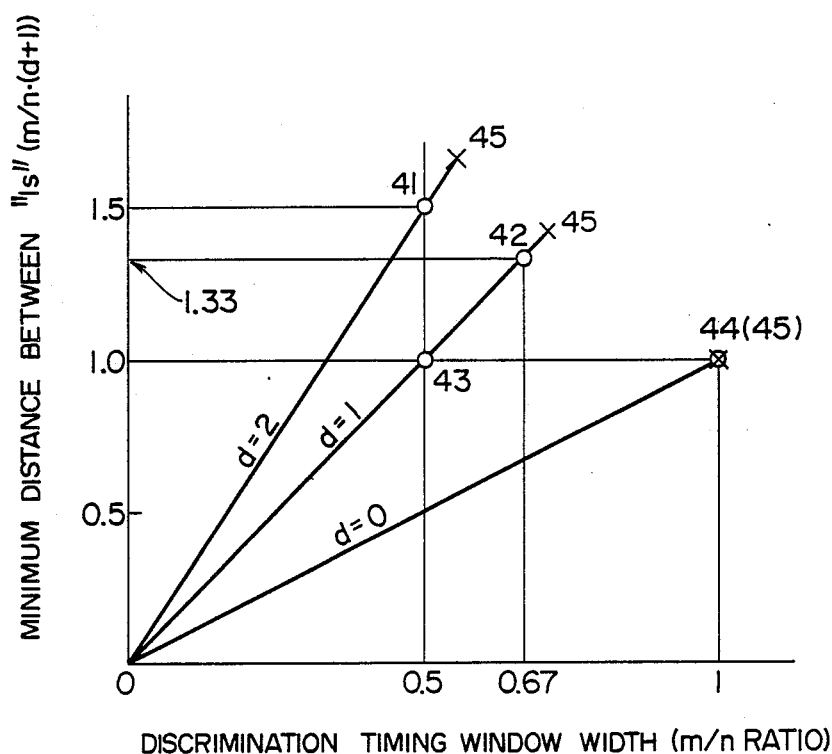
FIG. 4 shows the characteristics of conventional run length limited codes with respect to various R and W values.

The advantages of the above-described embodiments will be described in comparison with the conventional technique and with reference to FIG. 11 wherein the abscissa is m/n×s as different from FIG. 4, and conventional codes with s=1 are also shown.

Figure 11:
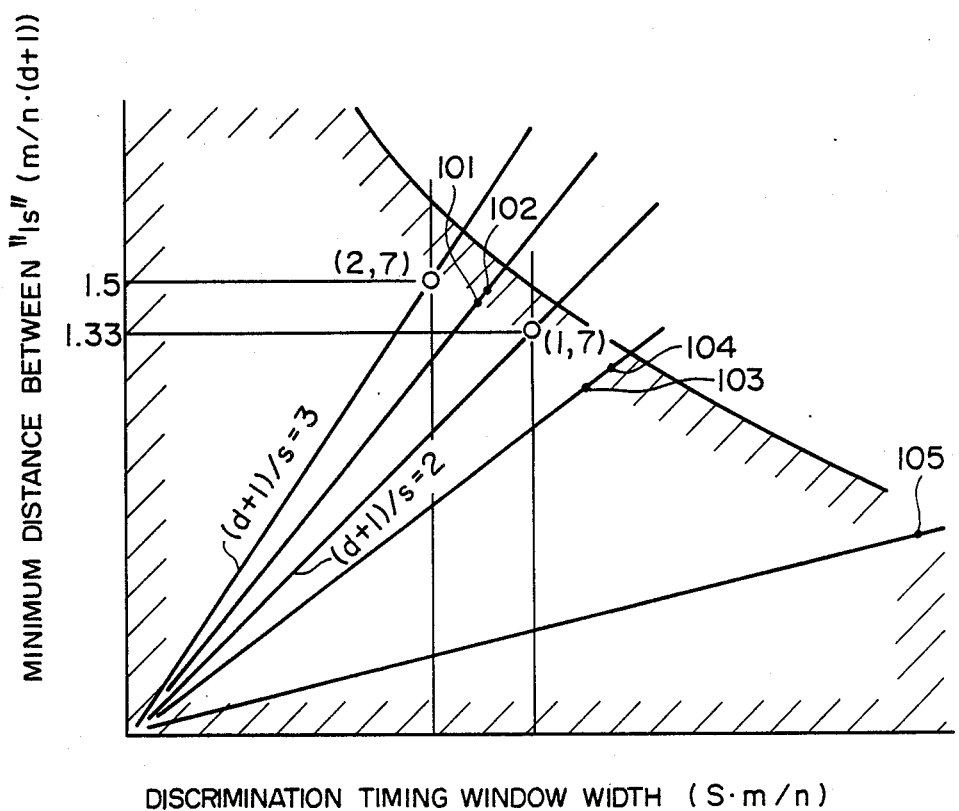
FIG. 11 shows the characteristics of codes of this invention with respect to various R and W values, similar to FIG. 4.

Referring to FIG. 11, points at 101, 102, 103, 104 and 105 respectively correspond to (4, 16, 2, 4, 14) codes, (4, 16, 2, 5, 17) codes, (2, 10, 2, 3, 8) codes, (2, 18, 2, 4, 10) codes and (0, 6, 2, 4, 6) codes 2 of the above-described embodiments. The characteristics of these codes can be readily understood from FIG. 11. In particular, points 101 and 102 locate substantially at the middle of conventional (2, 7) and (1, 7) codes. Points 103 and 104 locate at the middle of (1, 7) codes and NRZ codes. Point 105 locates far the right of NRZ codes, which means a larger discrimination window width.

The ratio of the ordinate [m/n×(d+1)] to the abscissa m/n×s is (d+1)/s representative of the gradient of a straight line on which codes are located. Therefore, if the values d and s are determined, the gradient of a straight line as shown in FIG. 11 can be identified and the corresponding codes are available on the straight line. Thus, it can be understood that it is possible to obtain any codes on a straight line whose gradient ranges from 0 to an infinite by selecting an optional positive integer value d including 0 and an optional positive integer value s. In the above embodiments, points 101 and 102 are on a straight line with a gradient 2.5, points 103 and 104 on a straight line with a gradient 1.5, and point 105 on a straight line with a gradient 0.5.

The channel capacity shown in FIG. 1 at $k=\infty$ can be calculated for various values of s. As seen from FIG. 11, the calculation results show that the channel capacities are represented by a curve which passes channel capacity points of conventional RLLC.

As described so far, it can be understood that codes can be realized on any point within the hatching portion of FIG. 11, thus extensively broadening the degree of freedom for available codes.

I claim:

1. A digital information coding method for transforming a binary code train of digital information without limitation of bit arrangement into another binary code train with limitation of bit arrangement, wherein said transformed binary code train is constructed of run length limited codes of the type that between a first binary digit and the next first binary digit, a second binary digit is inserted, and that the number (run length) of inserted consecutive digits takes a value between an optional integer minimum value d and another integer maximum value k, said run length taking a value obtained by adding an integer multiple of a specific positive integer s to said minimum value d, within the range of said minimum value d and said maximum value k, and wherein said positive integer s is 2 or more and is an aliquant number relative to d+1, and said maximum value k is a value obtained by adding an integer multiple of said positive integer s to said minimum value d.

2. A digital information coding method according to claim 1, wherein a 4 bit binary code train of digital information without limitation of bit arrangement is transformed into a 14 bit binary code train, and wherein between said first binary digit and said next first binary digit at the portion within the transformed code block and at the coupling portion between preceding and succeeding code blocks of said transformed code blocks, said second binary digit is inserted, and said numbers (run lengths) of inserted consecutive second binary digits are 4, 6, 8, 10, 12, 14 and 16 excepting other numbers.

3. A digital information coding method according to claim 1, wherein a 5 bit binary code train of digital information without limitation of bit arrangement is transformed into a 17 bit binary code train, and wherein between said first binary digit and said next first binary digit at the portion within the transformed code block and at the coupling portion between preceding and succeeding code blocks of said transformed code blocks, said second binary digit is inserted, and said numbers (run lengths) of inserted consecutive second binary digits are 4, 6, 8, 10, 12, 14 and 16 excepting other numbers.

4. A digital information coding method according to claim 1, wherein a 3 bit binary code train of digital information without limitation of bit arrangement is transformed into a 8 bit binary code train, and wherein between said first binary digit and said next first binary digit at the portion within the transformed code block and at the coupling portion between preceding and succeeding code blocks of said transformed code blocks, said second binary digit is inserted, and said numbers (run lengths) of inserted consecutive second binary digits are 2, 4, 6, 8 and 10 excepting other numbers.

5. A digital information coding method according to claim 1, wherein a 4 bit binary code train of digital information without limitation of bit arrangement is transformed into a 10 bit binary code train, and wherein between said first binary digit and said next first binary digit at the portion within the transformed code block and at the coupling portion between preceding and succeeding code blocks of said transformed code blocks, said second binary digit is inserted, and said numbers (run lengths) of inserted consecutive second binary digits are 2, 4, 6, 8, 10, 12, 14 and 18 excepting other numbers.

6. A digital information coding method according to claim 1, wherein a 4 bit binary code train of digital information without limitation of bit arrangement is transformed into a 6 bit binary code train, and wherein between said first binary digit and said next first binary digit at the portion within the transformed code block and at the coupling portion between preceding and succeeding code blocks of said transformed code blocks, said second binary digit is inserted, and said numbers (run lengths) of inserted consecutive second binary digits are 0, 2, 4 and 6 excepting other numbers.

7. A run length limited code discrimination method of discriminating a run length limited code from a signal pulse train of input data, wherein the run length limited code is of the type that between a first binary digit and the next first binary digit, a second binary digit is inserted, and that the number (run length) of inserted consecutive digits takes a value between an optional integer minimum value d and another integer maximum value k, said run length taking a value obtained by adding an integer multiple of a specific positive integer s to said minimum value d, within the range of said minimum value d and said maximum value k, and wherein said positive integer s is 2 or more and is an aliquant number relative to d+1, and said maximum value k is a value obtained by adding an integer multiple of said positive integer s to said minimum value d, said method comprising the steps of:

generating a clock signal having a period of said data signal bit interval in synchro with said signal pulse train of input data;

splitting said clock signal into separated S clock signal trains each having a phase shift by one clock period of said clock signal and having a pulse interval of S times as large as said one clock period;

splitting said signal pulse train of input data into separated S signal pulse trains, each signal pulse train being constructed of every S pulses derived from said signal pulse train of input data; and using said separated S signal pulse trains and the corresponding separated S clock signal trains, respectively of the same group, and discriminating each code in said respective signal pulse trains by a discrimination window having the width corresponding to the pulse interval of each of said S separated clock signal train.

8. A code discriminating system for reproducing magnetically recorded information and discriminating a code from the reproduced data signal pulse train, comprising:

means for inputting, as said data signal pulse train, run length limited codes of the type that between a first binary digit and the next first binary digit, a second binary digit is inserted, and that the number (run length) of inserted consecutive digits takes a value between an optional integer minimum value d and another integer maximum value k, said run length taking a value obtained by adding an integer multiple of a specific positive integer s to said minimum value d, within the range of said minimum value d and said maximum value k, and wherein said positive integer s is 2 or more and is an aliquant number relative to d+1, and said maximum value k is a value obtained by adding an integer multiple of said positive integer s to said minimum value d;

means for generating a clock signal having a period of said data signal bit interval in synchro with said signal pulse train of input data;

means for splitting said clock signal into separated S clock signal trains each having a phase shift by one clock period of said clock signal and having a pulse interval of S times as large as said one clock period;

means for splitting said signal pulse train of input data into separated S signal pulse trains, each signal pulse train being constructed of every S pulses derived from said signal pulse train of input data; and means for using said separated S signal pulse trains and the corresponding separated S clock signal trains, respectively of the same group, and discriminating each code in said respective signal pulse trains by a discrimination window having the width corresponding to the pulse interval of each of said S separated clock signal train.

9. A code discriminating system according to claim 8, wherein between a first binary digit and a next first binary digit a second binary digit is inserted, and the numbers (run lengths) of inserted consecutive second binary digits are 4, 6, 8, 10, 12, 14 and 16 excepting other numbers.

10. A code discriminating system according to claim 8, wherein between a first binary digit and a next first binary digit a second binary digit is inserted, and the numbers (run lengths) of inserted consecutive second binary digits are 2, 4, 6, 8 and 10 excepting other numbers.

11. A code discriminating system according to claim 8, wherein between a first binary digit and a next first binary digit a second binary digit is inserted, and the numbers (run lengths) of inserted consecutive second binary digits are 2, 4, 6, 8, 10, 12, 14, 16 and 18 excepting other numbers.

12. A code discriminating system according to claim 8, wherein between a first binary digit and a next first binary digit a second binary digit is inserted, and the numbers (run lengths) of inserted consecutive second binary digits are 0, 2, 4 and 6 excepting other numbers.

* * * * *

UNITED STATES PATENT AND TRADEMARK OFFICE
CERTIFICATE OF CORRECTION

PATENT NO. : 4,914,438

DATED : 4/3/90

INVENTOR(S) : Tadahiko Kameyama

It is certified that error appears in the above-identified patent and that said Letters Patent is hereby corrected as shown below:

| Column | Line | |
|---|---|---|
| 2 | 2 | Change "wodth" to --width--. |
| 2 | 67 | Change "codes" to --code--. |
| 3 | 36 | Change "in case" to --in a case--. |
| 4 | 4 | Change "been not" to --not been--. |
| 7 | 17 | Change "result" to --results--. |
| 7 | 19 | Change "satisfy" to --satisfies--. |
| 7 | 38 | After "FIG. 9" insert --.-- and delete the rest of line. |
| 7 | 39 | Delete entire line. |
| 7 | 55 | Change "splitted" to --split--. |
| 7 | 57 | Change "splitted" to --split--. |
| 7 | 61 | Change "splitted" to --split--. |
| 7 | 64 | Change "splitted" to --split--. |
| 8 | 9 | After "tens" insert --of--. |
| 8 | 27 | Change "splitted" to --split--. |
| 9 | 65 | Change "a 8 bit" to --an 8 bit--. |

UNITED STATES PATENT AND TRADEMARK OFFICE
CERTIFICATE OF CORRECTION

PATENT NO. : 4,914,438

DATED : 4/3/90

INVENTOR(S) : Tadahiko Kameyama

It is certified that error appears in the above-identified patent and that said Letters Patent is hereby corrected as shown below:

| Column | Line | |
|---|---|---|
| 11 | 25 | Change "S pluses" to --S pulse--. |

Signed and Sealed this

Fourteenth Day of July, 1992

*Attest:*

DOUGLAS B. COMER

*Attesting Officer*     *Acting Commissioner of Patents and Trademarks*